United States Patent
Yang

(10) Patent No.: US 7,674,641 B2
(45) Date of Patent: Mar. 9, 2010

(54) METHOD FOR FABRICATING WHITE-LIGHT-EMITTING FLIP-CHIP DIODE HAVING SILICON QUANTUM DOTS

(75) Inventor: Tsun-Neng Yang, Taoyuan (TW)

(73) Assignee: Atomic Energy Council, Taoyuan (TW)

( * ) Notice: Subject to any disclaimer, the term of this patent is extended or adjusted under 35 U.S.C. 154(b) by 126 days.

(21) Appl. No.: 11/402,031

(22) Filed: Apr. 12, 2006

(65) Prior Publication Data
US 2007/0243660 A1    Oct. 18, 2007

(51) Int. Cl.
*H01L 21/00* (2006.01)
(52) U.S. Cl. .................. 438/29; 438/108; 438/956; 438/962; 257/E29.071; 977/773; 977/890
(58) Field of Classification Search .......... 438/22, 438/23, 24, 25, 26, 27, 29, 46, 106, 108, 438/455, 608, 609, 962; 257/E29.168, E29.169, 257/E29.071, E33.064, E31.126, E29.327, 257/E21.503, E21.511; 977/773, 882, 890
See application file for complete search history.

(56) References Cited

U.S. PATENT DOCUMENTS

| | | | |
|---|---|---|---|
| 6,544,870 B2 * | 4/2003 | Park et al. ................... 438/507 |
| 6,946,309 B2 * | 9/2005 | Camras et al. ................ 438/26 |
| 7,358,101 B2 * | 4/2008 | Yang et al. ..................... 438/21 |
| 7,402,831 B2 * | 7/2008 | Miller et al. ................... 257/13 |
| 2004/0106222 A1 * | 6/2004 | Steckl et al. .................. 438/22 |
| 2004/0129944 A1 * | 7/2004 | Chen ........................... 257/89 |
| 2004/0214362 A1 * | 10/2004 | Hill et al. ...................... 438/33 |
| 2005/0074973 A1 * | 4/2005 | Ouchi et al. ................. 438/689 |
| 2005/0157367 A1 * | 7/2005 | Miyazawa ................... 359/245 |
| 2006/0043884 A1 * | 3/2006 | Yang et al. .................. 313/506 |
| 2006/0244358 A1 * | 11/2006 | Kim et al. ................... 313/486 |

OTHER PUBLICATIONS

N. M. Park et al. ("Band gap engineering of amorphous silicon quantum dots for light-emitting diodes," Mar. 5, 2001, Applied Physics Letter, vol. 78, No. 17, p. 2575-2577).*
Wolf et al., "Silicon Processing for the VLSI Era vol. 1- Process Technology", Second Edition, ISBN 0-9616721-6-1, 2000, pp. 857-858.*

* cited by examiner

*Primary Examiner*—Ha Tran T Nguyen
*Assistant Examiner*—Daniel Whalen
(74) *Attorney, Agent, or Firm*—Jackson IPG PLLC

(57) ABSTRACT

The present invention is to fabricate a flip-chip diode which emits a white light. The diode has a film embedded with silicon quantum dots. And the white light is formed by mixing colorful lights through the film.

7 Claims, 5 Drawing Sheets

METHOD FOR FABRICATING WHITE-LIGHT-EMITTING FLIP-CHIP DIODE HAVING SILICON QUANTUM DOTS

FIELD OF THE INVENTION

The present invention relates to fabricating a diode; more particularly, relates to emitting a white light of evenly mixed colorful lights through a film having silicon quantum dots.

DESCRIPTION OF THE RELATED ARTS

A prior art, "A diode emitting a white light and a fabrication method thereof", is proclaimed in Taiwan where the diode comprises a first conductive electrode;

a base of GaAs, GaP, Si or 3C-sic electrically contacted with the first conductive electrode;

a first emitting part, made of compounds of AlGaInP, having a first bondage layer, an active layer and a second bondage layer sequentially formed on the base;

A buffer layer made of $B_xGa_{(1-x)}P$ and $In_yGa_{(1-y)}N$, $0<x<1$ and $0<y<1$, on the second bondage layer.

a second emitting part, made of compounds of AlGaInN, having a first bondage layer, an active layer and a second bondage layer sequentially formed on the first buffer layer; and a second conductive electrode electrically contacted with the second bondage layer of the second emitting part.

When a potential difference is externally added between the second conductive electrode and the first conductive electrode, a current is obtained. The current flows through the second conductive electrode, the buffer layer and the first conductive electrode, where the first conductive electrode emits a light of a first wavelength; the second conductive electrode emits a light of a second wavelength; and a white light is obtained by mixing the light of the first wavelength and the light of the second wavelength.

Although the above prior art can generate a white light by mixing the light of the first wavelength and the light of the second wavelength, the structure is complex and the white light obtained is sometime polarized toward a blue light or a yellow light. Hence, the prior art does not fulfill users' requests on actual use.

SUMMARY OF THE INVENTION

The main purpose of the present invention is to emit a white light of colorful lights evenly mixed, where the colorful lights includes an ultra blue-violet light, which is emitted from a flip-chip diode; and a green light, a yellow light and a red light, which are emitted from a luminescent film material by exciting the silicon (Si) quantum dots of a film material with the ultra blue-violet light; and where the colorful lights are processed with refractions and diffractions through a transparent substrate.

To achieve the above purpose, the present invention is a method for fabricating a white-light-emitting flip-chip diode having Si quantum dots, where evenly embedded Si quantum dots are formed through a chemical vapor deposition or a sol-gel process in a luminescent film material; then the luminescent film material is coated on a transparent substrate; and, finally, a flip-chip diode is sticked to the luminescent film material on a light-extracting surface of the flip-chip diode for emitting a white light of evenly mixed colorful lights. Accordingly, a novel method for fabricating a white-light-emitting flip-chip diode having Si quantum dots is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
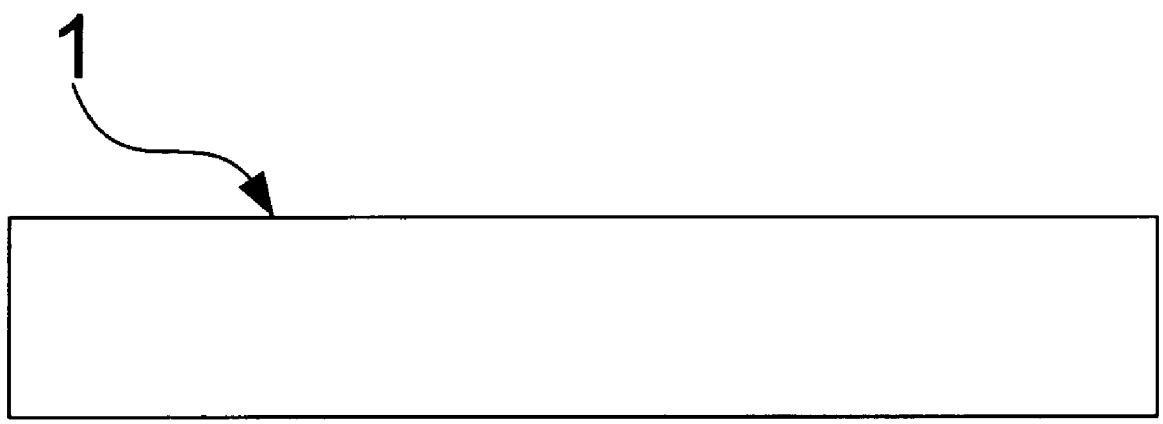
FIG. 1 is a view showing step (a) of a preferred embodiment according to the present invention.
Figure 2:
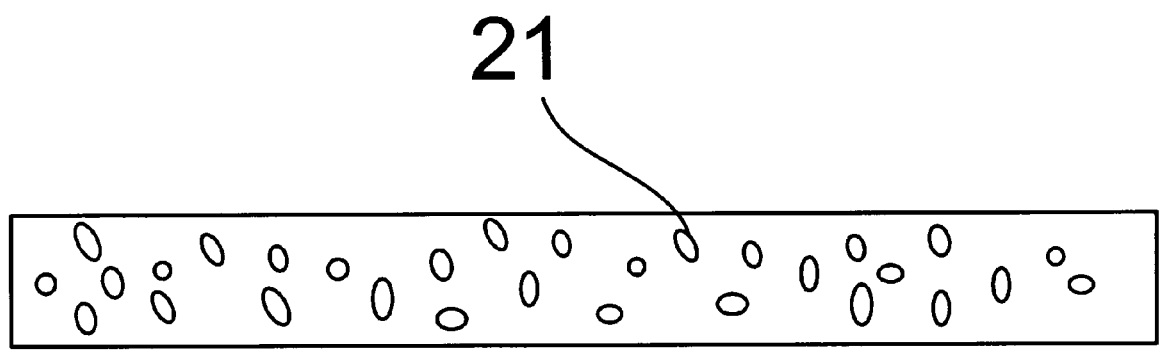
FIG. 2 is a view showing step (b)
Figure 3:
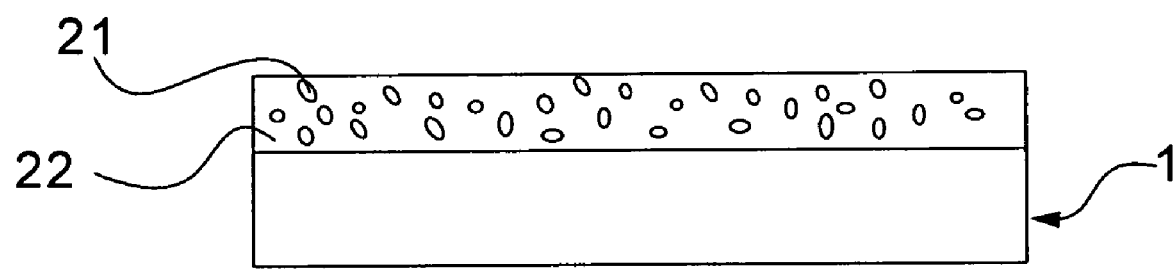
FIG. 3 is a view showing step (c)
Figure 4:
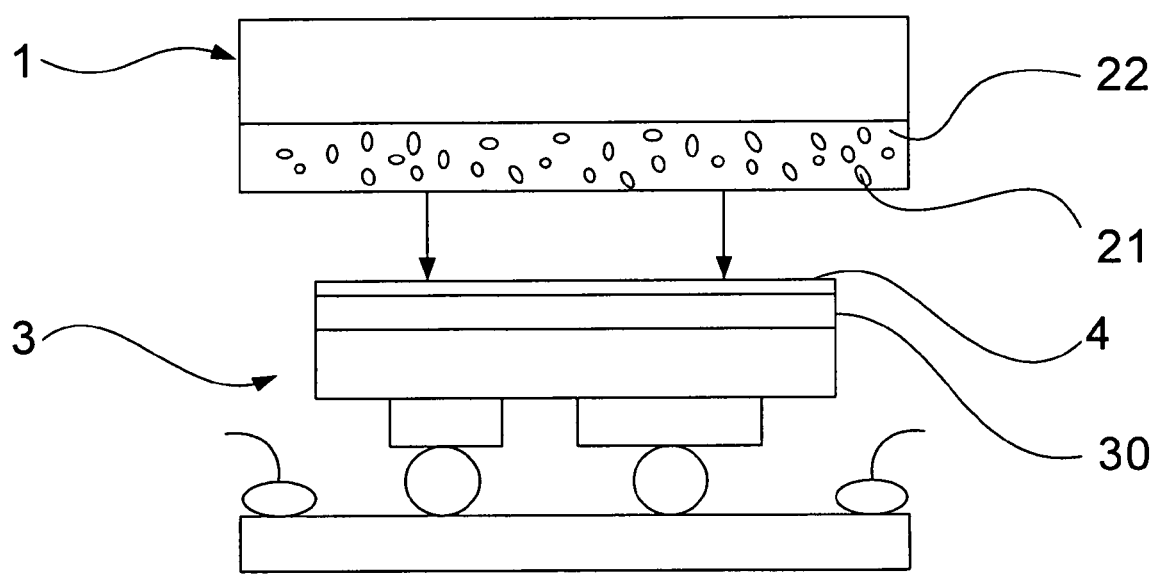
FIG. 4 is a view showing step (d)

Please refer to FIG. 1 till FIG. 4, which are views showing step (a) till step (d) of a preferred embodiment according to the present invention. As shown in the figures, the present invention is a method for fabricating a white-light-emitting flip-chip diode having silicon (Si) quantum dots, comprising the following steps:

Step (a): Obtaining a transparent substrate 1. The transparent substrate 1 is a conductive glass of indium tin oxide, a quartz or a sapphire.

Step (b): Obtaining a film material 22 of $SiO_2$, $Si_3N_4$ or SiC with evenly embedded Si quantum dots 21 of granular sizes between 1 and 10 nanometers formed through an atmospheric pressure chemical vapor deposition or a plasma-enhanced chemical vapor deposition, operated under a temperature between 100 and 1000 Celsius degrees or a sol-gel process to obtain a luminescent film material having Si quantum dots 21, which has a thickness between 1 and 100 micrometers.

Step (C): Coating the luminescent film material having Si quantum dots 21 on the transparent substrate 1.

Step (d) Obtaining a flip-chip diode emitting ultra blue-violet light 3 to be pasted with a transparent adhesive 4 on a light-extracting surface 31 (located on an upper surface of a transparent sapphire substrate of the flip-chip diode) to be adhered with the luminescent film material having Si quantum dots 2. The wavelength range of the ultra blue-violet light 3 is about 200-400 nm (nanometers).

Hence, a novel method for fabricating a white-light-emitting flip-chip diode having Si quantum dots is obtained.

Figure 5:
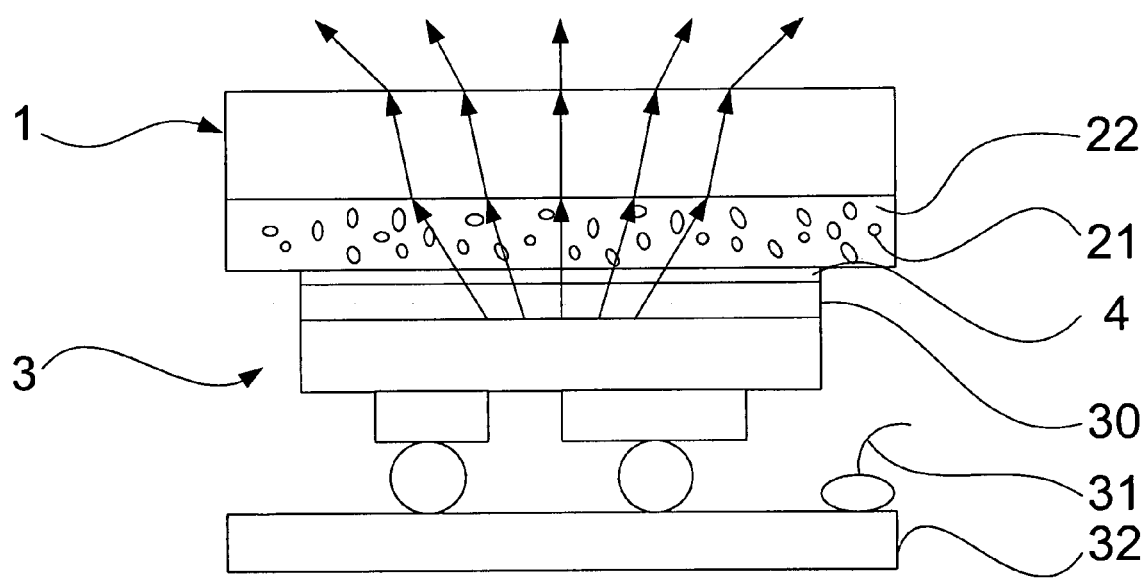
FIG. 5 is a view showing a state of use.

Please refer to FIG. 5, which is a view showing a state of use. As shown in the figure, when using the present invention, a leading wire 31 is contacted with a Si substrate 32; and, an ultra blue-violet light is emitted by the flip-chip diode by using a connection to an outside power supply. The ultra blue-violet light generated by the flip-chip diode 3 and the green light, yellow light and red light generated by exciting the Si quantum dots in the luminescent film material with the ultra blue-violet light, are processed with refractions and diffractions through the transparent substrate 1 for emitting a white light by evenly mixing colorful lights.

To sum up, the present invention is a method for fabricating a white-light-emitting flip-chip diode having Si quantum dots, where an ultra blue-violet light, which is emitted from a flip-chip diode, and a green light, a yellow light and a red light, which are emitted from a film material by exciting the Si quantum dots of the film material with the ultra blue-violet light, are processed with refractions and diffractions through a transparent substrate for emitting a white light of the above colorful lights evenly mixed.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for fabricating a white-light-emitting flip-chip diode having silicon (Si) quantum dots, comprising:

Step (a): Obtaining a transparent substrate;

Step (b): Obtaining a film material having evenly embedded Si quantum dots of granular sizes between 1 and 10 nanometers formed through a chemical vapor deposition operated under a temperature between 100 and 1000 Celsius degrees, the evenly embedded Si quantum dots being evenly distributed throughout the film material;

Step (c): Coating said transparent substrate with said film material having said Si quantum dots; and Step (d): Obtaining a flip-chip diode emitting an ultra blue-violet light coated with an adhesive on a light-extracting surface of said flip-chip diode and adhered with said film material having Si quantum dots, wherein said chemical vapor deposition is an atmospheric pressure chemical vapor deposition, wherein said ultra blue-violet light interacting with a green, yellow, and red light generated by the Si dots with diffraction and refraction through the transparent substrate to generate a white light.

2. The method according to claim 1, wherein said transparent substrate is a conductive glass of indium tin oxide.

3. The method according to claim 1, wherein said transparent substrate is a quartz.

4. The method according to claim 1, wherein said transparent substrate is a sapphire.

5. The method according to claim 1, wherein said atmospheric chemical vapor deposition is operated under a temperature located in a range selected from a group consisting of 100 to 500 Celsius degrees (° C.) and 800 to 1000° C.

6. The method according to claim 1, wherein said film material has a thickness between 1 and 100 micrometers.

7. The method according to claim 1, wherein said film material is made of a material selected from a group consisting of $SiO_2$, $Si_3N_4$ and SiC.

* * * * *